(12) United States Patent
Saitoh et al.

(10) Patent No.: US 6,920,164 B2
(45) Date of Patent: Jul. 19, 2005

(54) SEMICONDUCTOR LASER DEVICE

(75) Inventors: Masayuki Saitoh, Hamamatsu (JP); Hirofumi Kan, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 265 days.

(21) Appl. No.: 10/220,352

(22) PCT Filed: Mar. 1, 2001

(86) PCT No.: PCT/JP01/01569
§ 371 (c)(1),
(2), (4) Date: Aug. 29, 2002

(87) PCT Pub. No.: WO01/65614
PCT Pub. Date: Sep. 7, 2001

(65) Prior Publication Data
US 2003/0020161 A1 Jan. 30, 2003

(30) Foreign Application Priority Data
Mar. 1, 2000 (JP) .................................. 2000-056126

(51) Int. Cl.[7] .................................................. H01S 5/00
(52) U.S. Cl. ........................................ 372/45; 372/50
(58) Field of Search .............................. 372/43–50, 75, 372/92–99

(56) References Cited

U.S. PATENT DOCUMENTS 5,729,561 A * 3/1998 Hironaka ..................... 372/36

FOREIGN PATENT DOCUMENTS

| JP | 51-41980 | | 4/1976 | |
|----|----------|---|--------|---|
| JP | 59-031085 | * | 2/1984 | ............ H01S/3/18 |
| JP | 1-109790 | | 4/1989 | |
| JP | 01-109790 | * | 4/1989 | ............ H01S/3/18 |
| JP | 1-40514 | | 8/1989 | |
| JP | 3-66191 | | 3/1991 | |
| JP | 03-066191 | * | 3/1991 | ............ H01S/3/18 |
| JP | 5-299446 | | 11/1993 | |
| JP | 05-299446 | * | 11/1993 | ........... H01L/21/52 |

* cited by examiner

Primary Examiner—Minsun Oh Harvey
Assistant Examiner—Tuan N. Nguyen
(74) Attorney, Agent, or Firm—Morgan Lewis & Bockius LLP

(57) ABSTRACT

This semiconductor laser device comprises a semiconductor laser element 10, which is provided with a Cr layer 13 and an Au layer 14, a silicon submount 20, which is provided with a Cr layer 22 and an Au layer 23, and a metal base 30. The surface of the semiconductor laser element 10 on which the Au layer 14 is provided and the surface of the silicon submount 20 on which the Au layer 23 is provided are directly joined together.

8 Claims, 3 Drawing Sheets

SEMICONDUCTOR LASER DEVICE

TECHNICAL FIELD

The present invention relates to a semiconductor laser device, and particularly to the construction of a semiconductor laser device for radiating heat from an active layer.

BACKGROUND ART

FIG. 4 is a longitudinal sectional view of a conventional semiconductor laser device. Reference numeral 10 is a semiconductor laser element, reference numeral 11 is an LD (laser diode), reference numeral 12 is an active layer, reference numeral 13 is a Cr layer, reference numeral 14 is an Au layer, reference numeral 15 is an Au layer, reference numeral 16 is an Au—Ge layer, reference numeral 17 is an Au layer, reference numeral 30 is a metal base, reference numeral 31 is a metal block, and reference numeral 40 is a conductive adhesive. In order to radiate the heat that is generated in the active layer 12, the semiconductor laser element 10 is attached to the metal base 30 by the conductive adhesive 40. The metal base 30 functions as a heat sink.

FIG. 5 is a longitudinal sectional view of a different semiconductor laser device. This device is disclosed in Japanese Patent Application Laid-open No. S59-31085. In this device, in order to radiate the heat generated from a light 12 shown in FIG. 4, a silicon submount 20 is inserted between the semiconductor laser element 10 and the metal base 30, and each of these are constituted by brazing with a gold and silicon brazing material 50 and 60. Note that the silicon submount 20 is made from a heat sink with a thermal expansion coefficient close to the material constituting the semiconductor laser element.

DISCLOSURE OF THE INVENTION

However, the semiconductor laser device shown in FIG. 4 has problems associated with it, such as the conductive adhesive 40 entering the resonator surface of the active layer 12, or adhering thereto during attachment, and this contaminates the resonator surface and produces a defective product. The problem also arises that a sufficient radiation effect cannot be obtained due to voids being produced inside the conductive adhesive 40.

Further, there are also problems with the semiconductor laser device shown in FIG. 5, in that the resonator surface of the active layer 12 becomes contaminated due to brazing material 50 surrounding and entering the resonator surface, creating the possibility of producing a defective product.

Therefore, an object of the present invention is to provide a semiconductor laser device that is able to effectively radiate heat generated in the active layer, without contaminating the resonator surface of the semiconductor laser element.

In order to solve the above-mentioned problems, the semiconductor laser device according to the present invention comprises: a heat sink interposed between a semiconductor laser element having an active layer, and a metal base, wherein a metallic layer and an Au layer are provided on whichever of the front or back surfaces of the semiconductor laser element is closer to the active layer; a metallic layer and an Au layer are provided on the surface of the heat sink on the semiconductor laser element side; and the Au layer that is provided on the semiconductor laser element and the Au layer that is provided on the heat sink are joined together. Note that it is desirable that the base and the heat sink are attached by a conductive adhesive or joined using a metallic layer and an Au layer in a similar way to the above.

More specifically, this semiconductor laser device is constituted by comprising: a semiconductor laser element; a metal base; and a heat sink interposed between the semiconductor laser element and the metal base, wherein a first metallic layer to increase the adhesiveness of the gold and the semiconductor laser element, and a first Au layer on the upper surface thereof are provided on the surface of the semiconductor laser element on which the active layer is formed. A second metallic layer to increase the adhesiveness of the gold and the heat sink and prevent eutectic bonding, and a second Au layer on the upper surface thereof are provided on the heat sink. The surface of the semiconductor laser element on which the first Au layer is provided and the surface of the heat sink on which the second Au layer is provided are directly joined, and the surface of the heat sink opposing the surface to which the semiconductor laser element is directly joined is attached to the metal base with the conductive adhesive.

In this way, since the semiconductor laser element and the heat sink are directly joined, the resonator surface of the semiconductor laser does not become contaminated. Further, since the resonator surface does not become contaminated, the surface of the semiconductor laser element on which the active layer is formed and the heat sink can be directly joined. Accordingly, since the semiconductor laser element and the heat sink are joined with good adhesiveness, the heat from the active layer can be effectively radiated directly to the silicon submount.

Further, the semiconductor laser device according to the present invention is constituted by comprising: a semiconductor laser element; a metal base; and a heat sink interposed between the semiconductor laser element and the metal base, wherein a first metallic layer to increase the adhesiveness of the gold and the semiconductor laser element, and a first Au layer on the upper surface thereof are provided on the surface of the semiconductor laser element on which the active layer is formed. A second metallic layer to increase the adhesiveness of the gold and the heat sink and prevent eutectic bonding, and a second Au layer on the upper surface thereof are provided on the heat sink. A third metallic layer to increase the adhesiveness of the gold and the metal base, and a third Au layer on the upper surface thereof are provided on the metal base. The surface of the semiconductor laser element on which the first Au layer is provided and one side of the heat sink on which the second Au layer is provided, and the other side of the heat sink on which the second Au layer is provided and the surface of the metal base on which the third Au layer is provided are each in contact and directly joined to each other.

In this way, since the semiconductor laser element, the heat sink and the metal base are directly joined, the semiconductor laser device can be made at one time, improving labor efficiency. Further, since the semiconductor laser element and the heat sink are directly joined, the resonator surface of the semiconductor laser does not become contaminated. Further, since the resonator surface does not become contaminated, the surface of the semiconductor laser element on which the active layer is formed and the heat sink can be directly joined. Accordingly, since the semiconductor laser element and the heat sink are joined with good adhesiveness, the heat from the active layer can be effectively radiated directly to the silicon submount.

Further, the semiconductor laser device according to the present invention may have a heat sink made of silicon, and the second metallic layer may function to prevent eutectic bonding of the gold and the silicon. Silicon has a similar thermal expansion coefficient to a compound semiconductor made from GaAs or the like, which forms the semiconductor laser element. Therefore by making the heat sink from silicon, heat from the active layer can be effectively dispersed and radiated. Further, since a second metallic layer is inserted between the second Au layer and the heat sink made of silicon in order to prevent the eutectic bonding of the gold and the silicon, this can prevent the formation of brazing materials due to eutectic bonding of the second Au layer and the silicon heat sink, thereby preventing contamination of the active layer's resonator surface due to gold and silicon brazing material.

BEST MODES FOR CARRYING OUT THE INVENTION

Figure 1:
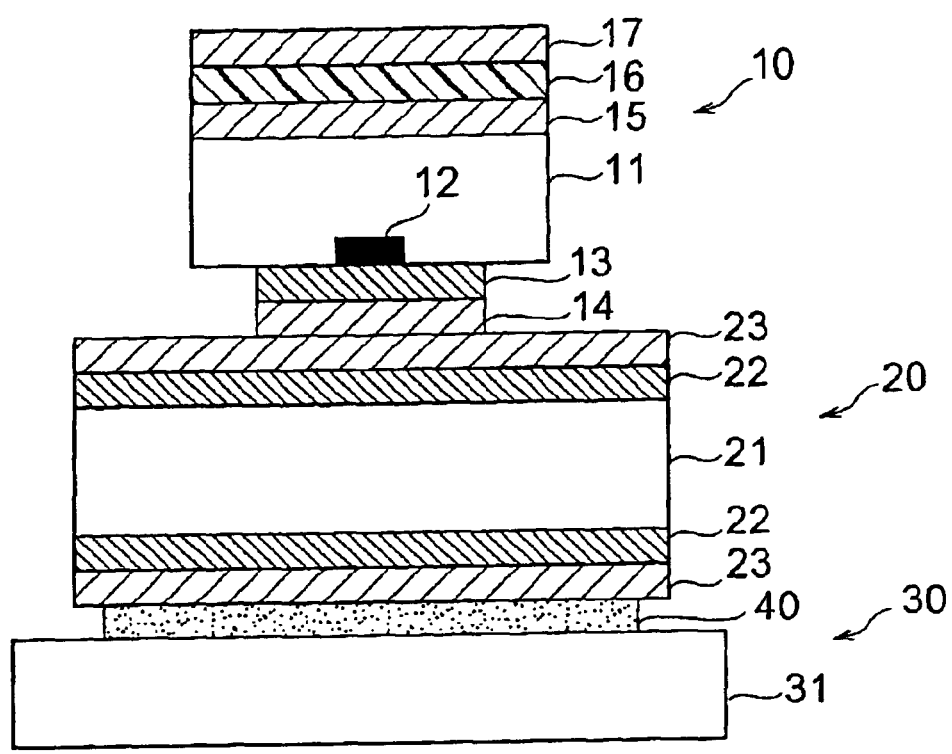
FIG. 1 is a sectional view of a semiconductor laser device according to the first embodiment.

Embodiments of the present invention will be described below with reference to the accompanying drawings. The same reference numerals are used to indicate the same elements and repetitive explanations are omitted.

FIG. 1 shows a sectional view of a semiconductor laser device according to the first embodiment. A semiconductor laser device according to the first embodiment comprises a semiconductor laser element 10, a silicon submount 20, and a metal base 30.

The semiconductor laser element 10 has a laser diode (LD) 11 containing an active layer 12 made of GaAs, a Cr (metallic) layer 13 with a film thickness of 10 to 30 nm, an electrode made of an Au layer 14 with a film thickness of 300 to 1000 nm, an Au layer 15 with a film thickness of 10 nm, an Au—Ge layer 16 with a film thickness of 250 nm, and an electrode made of an Au layer 17 with a film thickness of 750 nm.

The silicon submount 20 has a p-type silicon layer 21 as a heat sink, a Cr (metallic) layer 22 with a film thickness of 10 to 30 nm, and an Au layer 23 with a film thickness of 300 to 1000 nm. The metal base 30 has a metal block 31 made of Cu.

The Au layer 14 of the semiconductor laser element 10 and the Au layer 23 of the silicon submount 20 are directly joined, and the Au layer 23 of the silicon submount 20 and the metal block 31 of the metal base 30 are attached by a conductive adhesive 40 made of copper solder, and the semiconductor laser device according to the first embodiment is thereby constituted.

According to the construction of the semiconductor laser device of the first embodiment shown in FIG. 1, since the semiconductor laser element 10 and the silicon submount 20 are directly joined, the resonator surface of the active layer 12 does not become contaminated, and it is difficult to produce a defective product, so a good yield can be produced. Note that with regard to the active layer 12, the longitudinal direction of the resonator is at right angles to the thickness direction of the semiconductor laser element 10, and laser light is outputted from the end surface (resonator surface) in the longitudinal direction.

In the semiconductor laser device according to the present embodiment, since the resonator surface of the active layer 12 does not become contaminated, the surface of the semiconductor laser 10 on which the active layer 12 is formed, can be directly joined to the silicon submount 20. Accordingly the semiconductor laser element 10 and the silicon submount 20 are joined together with good adhesiveness, and the heat from the active layer 12 is effectively radiated directly to the silicon submount 20.

In addition, since the Cr layer 22 is inserted between the Au layer 23 and the silicon (Si) layer 21 in order to prevent eutectic bonding of the gold and the silicon, formation of brazing material due to eutectic bonding of the Au layer 23 and the silicon layer 21 can be prevented, thereby preventing contamination of the resonator surface of the active layer 12 due to gold and silicon brazing material. Further, by providing the Cr layer 13 and the Cr layer 22, peeling of the Au layer 14 and the Au layer 23 can be prevented.

Figure 2:
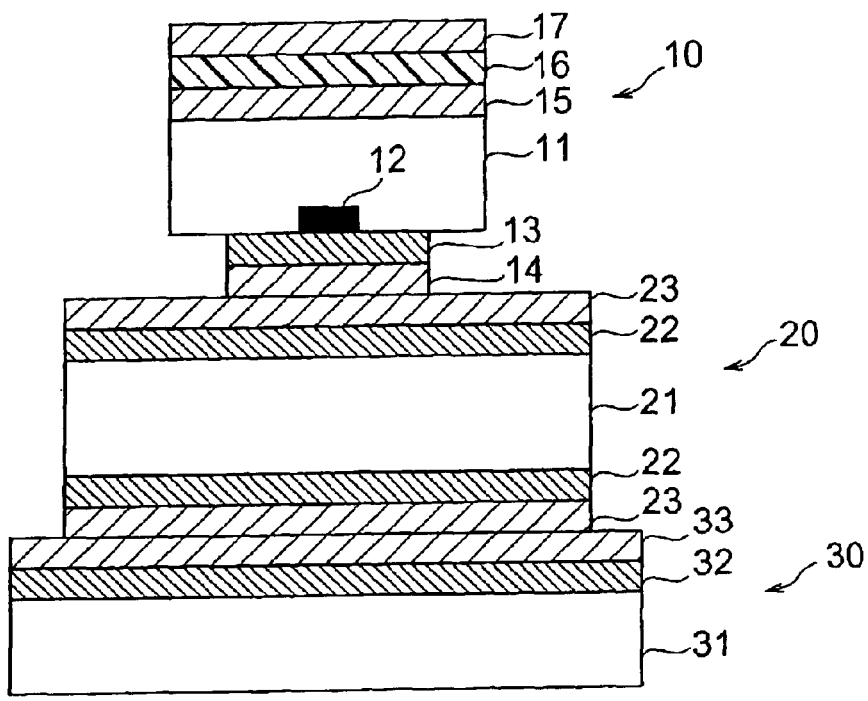
FIG. 2 is a sectional view of a semiconductor laser device according to the second embodiment.

FIG. 2 is a sectional view of a semiconductor laser device according to the second embodiment.

The semiconductor laser device according to this embodiment comprises a semiconductor laser element 10, a silicon submount 20, and a metal base 30.

The semiconductor laser element 10 has an LD 11 containing an active layer 12 made of GaAs, a Cr (metallic) layer 13 with a film thickness of 10 to 30 nm, an electrode made of an Au layer 14 with a film thickness of 300 to 1000 nm, an Au layer 15 with a film thickness of 10 nm, an Au—Ge layer 16 with a film thickness of 250 nm, and an electrode made of an Au layer 17 with a film thickness of 750 nm.

The silicon submount 20 has a P-type silicon layer 21 as a heat sink, a Cr (metallic) layer 22 with a film thickness of 10 to 30 nm, and an Au layer 23 with a film thickness of 300 to 1000 nm. The metal base 30 has a metal block 31 made of Cu, a Cr (metallic) layer 32, and an Au layer 33.

The Au layer 14 of the semiconductor laser element 10, the Au layer 23 of the silicon submount 20, the surface opposing the Au layer 14 of the semiconductor laser element 10, the Au layer 23 of the silicon submount 20 provided on the opposite side, and the Au layer 33 of the metal base 30 are simultaneously directly joined, and the semiconductor laser device of the second embodiment is thereby constituted.

More specifically, the thickness of the metallic layer 13, the metallic layer 22 and/or the metallic layer 32 is at least 10 nm and no more than 30 nm. If the thickness of the metallic layers 13 and 22 is less than the above-mentioned lower limit, the adhesive force declines, and if it is greater than the above-mentioned upper limit the manufacturing cost increases.

Further, the thickness of the Au layer 14, the Au layer 23 and/or the Au layer 33 is at least 300 nm and not more than 1000 nm. If the thickness of the Au layers 14, 23, and 33 is less than the above-mentioned lower limit, the adhesive force declines, and if it is greater than the above-mentioned upper limit, manufacturing cost is increased.

According to the construction of the semiconductor laser device of the second embodiment shown in FIG. 2, since the semiconductor laser element 10, the silicon submount 20 and the metal base 30 are directly joined, the semiconductor laser device can be made at one time, and labor efficiency can be improved. Further, since the semiconductor laser element 10 and the silicon submount 20 are directly joined, the resonator surface of the active layer 12 does not become contaminated, and it is difficult to produce a defective product, so a good yield can be produced.

Further, since the resonator surface of the active layer 12 does not become contaminated, the surface of the semiconductor laser 10 on which the active layer 12 is formed and the silicon submount 20 can be directly joined. Accordingly, since the semiconductor laser element 10 and the silicon submount 20 are joined together with good adhesiveness, the heat from the active layer 12 is directly and effectively radiated to the silicon submount 20.

In addition, since the Cr layer 22 is inserted between the Au layer 23 and the silicon layer 21 in order to prevent eutectic bonding of the gold and the silicon, formation of brazing material due to eutectic bonding of the Au layer 23 and the silicon layer 21 can be prevented, thereby preventing contamination of the resonator surface of the active layer 12 due to gold and silicon brazing material. Further, by providing the Cr layer 13 and the Cr layer 22, peeling of the Au layer 14 and the Au layer 23 can be prevented.

Figure 3:
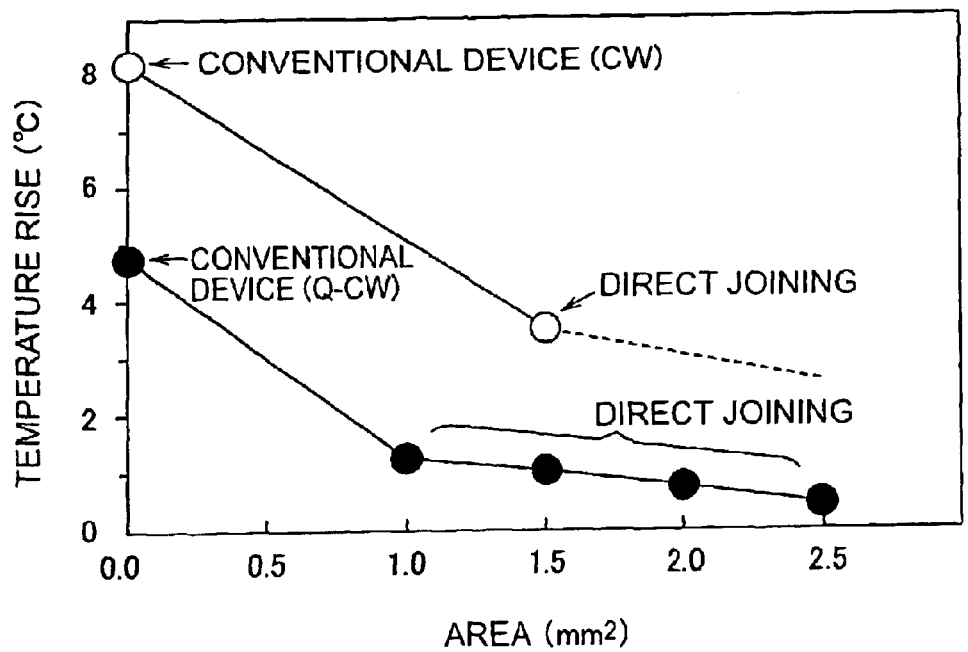
FIG. 3 is a graph comparing the temperature rise when a semiconductor laser device according to the first embodiment is operated, compared to a conventional semiconductor laser device.
Figure 4:
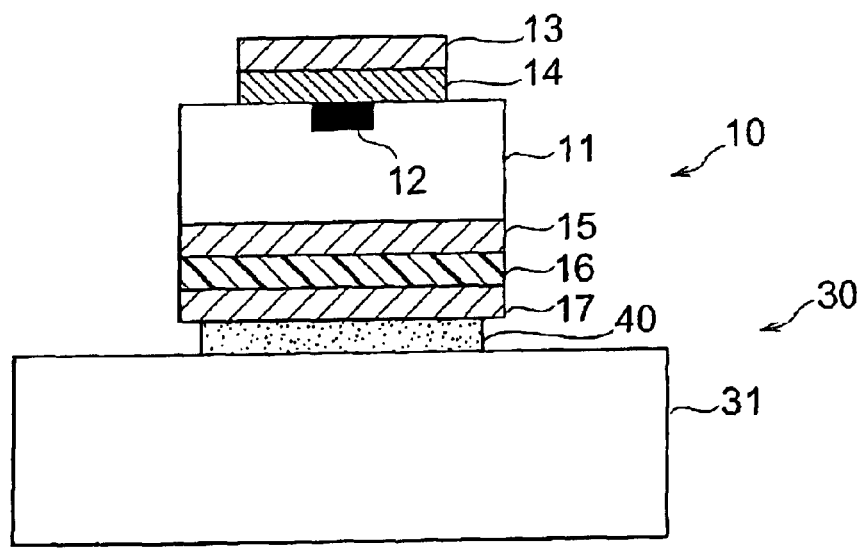
FIG. 4 is a sectional view of a conventional semiconductor laser device.
Figure 5:
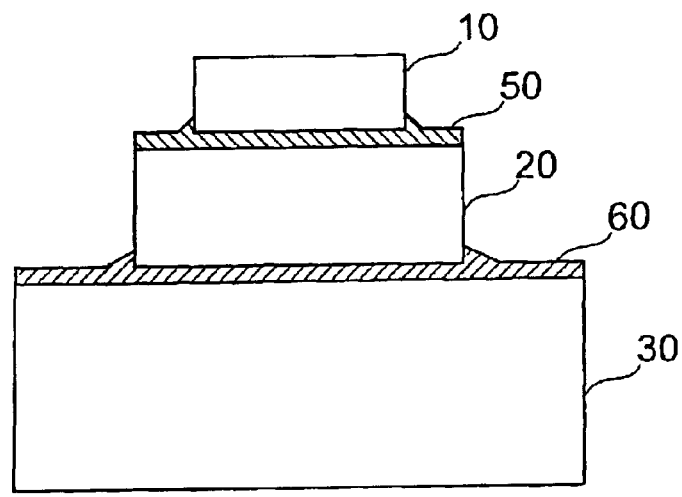
FIG. 5 is a sectional view of a conventional semiconductor laser device.

Next, a graph is shown in FIG. 3 of the temperature rise of the semiconductor laser element 10 in the semiconductor laser device according to the first embodiment shown in FIG. 1, and the conventional semiconductor laser device shown in FIG. 4, when an electric current is increased from 10A to 30A and the device is operated. The graph also shows the rise in temperature when the area of the silicon submount 20 in the semiconductor laser device in FIG. 1 is changed.

As can be seen from FIG. 3, in comparison to the conventional semiconductor laser device shown in FIG. 4 that is not provided with a silicon submount 20, in the semiconductor laser device of the first embodiment shown in FIG. 1 that is provided with the silicon submount 20, the temperature rise of the semiconductor element 10 is hugely reduced. It was possible to reduce the temperature rise by approximately 60% with a CW-laser and approximately 90% with a Q-CW-laser. Further, by making the area of the silicon submount 20 larger, it can be seen that the temperature rise can be further reduced.

Note that the first and second embodiments are not limited to the above. The material for the LD 11 is not limited to GaAs, and maybe InGaAs or another compound semiconductor. Further, a silicon layer 21 is used for the heat sink, but a material such as diamond, which has a thermal expansion coefficient similar to the LD 11 may also be used for the heat sink. Further, Cu is used as an example of a material for the metal block 31, but any material can be used, such as CuW, Kovar metal or SiC, as long as it has a good thermal conductivity. Further, copper solder is used as an example of the conductive adhesive 40, however other conductive adhesives may also be used, such as silver paste or lead-copper.

In addition, Cr is used as an example of a metal to prevent eutectic bonding of the gold (Au) and silicon (Si) and increase adhesiveness of the Au layer, however other materials may be used instead of Cr, such as Ti, Pt, or Mo, as long as the material can prevent eutectic bonding of the gold and the silicon, and adheres sufficiently to the LD 11, silicon layer 21, metal block 31 and Au layer. Further, the type of metallic layer provided on the LD 11, silicon layer 21 and metal block 31 does not have to be the same. Note that if the heat sink is made of a material other than silicon (Si), the type of metallic material that will prevent eutectic bonding of the gold and the heat sink, and increase the adhesiveness of the Au layer will obviously be different.

As described in detail above, with respect to the semiconductor laser device, since the semiconductor laser element and the heat sink are directly joined, the resonator surface of the active layer of the semiconductor laser element does not become contaminated and it is difficult to produce a defective product, so a good yield is produced. Further, since the resonator surface of the active layer does not become contaminated, the surface of the semiconductor laser element on which the active layer is formed and the silicon submount can be directly joined, thereby joining the semiconductor laser element and the heat sink with good adhesiveness. Thus, the heat from the active layer can be directly and effectively radiated to the heat sink.

In addition, since a metallic layer is inserted between the Au layer and the heat sink in order to prevent eutectic bonding of the gold and the heat sink material and increase the adhesiveness of the Au layer, formation of brazing material due to eutectic bonding of the Au layer and the heat sink material can be prevented, thereby preventing contamination of the resonator surface of the active layer due to brazing material formed from the gold and heat sink material.

Accordingly, the temperature rise of the active layer of the semiconductor laser element can be kept down and deterioration in the properties of the semiconductor laser can be prevented. Further, since it is possible to directly join an optical element consisting of a compound semiconductor such as GaAs with silicon, an optoelectronic integrated circuit (OEIC) can be achieved.

INDUSTRIAL APPLICABILITY

The present invention can be used in a semiconductor laser device.

What is claimed is:

1. A semiconductor laser device comprising a heat sink interposed between a semiconductor laser element having an active layer and a metal base, wherein a metallic layer and an Au layer are provided on the front or back surfaces of the semiconductor laser element whichever is closer to the active layer; a second metallic layer and an second Au layer are provided on the surface of said heat sink on said semiconductor laser element side; and said Au layer that is provided on the semiconductor laser element and said second Au layer that is provided on said heat sink are directly joined together.

2. The semiconductor laser device according to claim 1, wherein said base and said heat sink are attached by a conductive adhesive.

3. The semiconductor laser device according to claim 1, wherein a metallic layer and an Au layer are provided on said base; a different metallic layer and Au layer are provided on said heat sink; and said Au layer that is provided on said base and said different Au layer that is provided on said heat sink are joined together.

4. The semiconductor laser device according to claim 1, wherein said heat sink is made of Si, and one of said metallic layers contains a material selected from the group consisting of Cr, Ti, Pt and Mo.

5. The semiconductor laser device according to claim 4, wherein the film thickness of said metallic layer is at least 10 nm.

6. The semiconductor laser device according to claim 5, wherein the film thickness of said metallic layer is no more than 30 mm.

7. The semiconductor laser device according to claim 6, wherein the film thickness of one of said Au layers is at least 300 nm.

8. The semiconductor laser device according to claim 7, wherein the film thickness of one of said Au layers is no more than 1000 nm.

* * * * *